United States Patent [19]

Tomita et al.

[11] 4,324,850
[45] Apr. 13, 1982

[54] METHOD OF FORMING A FLUORESCENT SCREEN FOR A COLOR PICTURE TUBE

[75] Inventors: Yoshifumi Tomita; Masahiro Nishizawa; Hiroshi Yokomizo; Hiromitu Nakai, all of Mobara, Japan

[73] Assignee: Hitaci, Ltd., Tokyo, Japan

[21] Appl. No.: 125,694

[22] Filed: Feb. 28, 1980

[30] Foreign Application Priority Data

Apr. 18, 1979 [JP] Japan .................................. 54-46649

[51] Int. Cl.³ ................................................ G03C 5/00
[52] U.S. Cl. ......................................... 430/24; 430/25; 430/28; 430/144; 430/394; 430/396; 430/494; 430/952; 354/1
[58] Field of Search ........................ 430/23, 24, 25, 28, 430/394, 396, 494, 952, 144; 354/1

[56] References Cited

U.S. PATENT DOCUMENTS 4,045,224  8/1977  Yamazaki et al. .................... 430/24

Primary Examiner—J. Travis Brown
Attorney, Agent, or Firm—Charles E. Pfund

[57] ABSTRACT

In forming a fluorescent screen for a color picture tube having triads of phosphor materials of the three primary colors arranged in a predetermined pattern on the inner surface of a panel, a photosensitive film which exhibits stickiness when exposed to a threshold amount of light is formed on the inner surface of the panel. Locations of the photosensitive film where the three color phosphor materials respectively occupy are exposed to light from a light source through a shadow mask mounted to the panel. The amount of exposure light for a first color phosphor material is the threshold or above and that for second and third phosphor materials is below the threshold. After completion of the light exposures for the first to third color phosphor materials through the shadow mask, the shadow mask is dismounted from the panel and the first color phosphor material is deposited onto the photosensitive film. A first back exposure is then carried out and the second color phosphor material is deposited onto the photosensitive film. Thereafter, a second back exposure is carried out and the third color phosphor material is deposited onto the photosensitive film.

8 Claims, 2 Drawing Figures

METHOD OF FORMING A FLUORESCENT SCREEN FOR A COLOR PICTURE TUBE

BACKGROUND OF THE INVENTION

This invention relates to a method of forming a fluorescent screen for a color picture tube using photosensitive material which exhibits stickiness when exposed to light.

There have been proposed such methods as photographic method or printing method for forming a fluorescent screen for a color picture tube. Among them, the photographic method has been most preferred for use in mass-production. As well known in the art this photographic method is based on the utilization of photoresist and carries out formation of a fluorescent screen of triads of phosphors of primary colors, red, blue and green, in the form of dots or stripes on the inner surface of the panel by repeating exposing and developing steps.

Conventionally, for forming the fluorescent screen, there have been availed various methods, of which one uses a mixture of phosphor material, photosensitive agent and water which is in the form of slurry (referred to as slurry method hereinafter) and another, proposed by the same applicant as the present application, uses a material which becomes sticky by photo-exposure (referred to as dry method hereinafter). The former, slurry method uses a larger amount of solution than the latter, dry method. Therefore, the latter is superior to the former as regards to the mass-producibility. This invention is involved in the field of the latter dry method. One may refer to Japanese patent application laid-open No. 126861/'78 as an article disclosing the dry method.

The dry method of forming a fluorescent screen comprises forming a photosensitive film on the inner face of a panel which becomes sticky when exposed to light; attaching a mask with apertures of a predetermined pattern, such as a shadow mask, to the interior of the panel; exposing to light locations at which a phosphor material of a first color, for instance, blue, should be coated; removing the shadow mask; spraying phosphor powder of blue color on the panel inner face; and fixing the phosphor materials only on the locations which have become sticky. The shadow mask is attached again to the interior of the panel under this condition, and locations of the photosensitive film on which a phosphor material of a second color should be coated are exposed to light by, for example, displacing a light exposure source. The shadow mask is removed after making the location sticky and the phosphor material of the second color, for instance, phosphor powder of green color is sprayed on the inner face of the panel to be fixedly attached to the locations which exhibit stickiness. A similar process is repeated for a third color, thereby forming a predetermined pattern of triads of phosphor materials. Thereafter, known filming, metal backing and baking processes are carried out to complete a fluorescent screen.

The method to form the fluorescent screen described above requires to mount and dismount the shadow mask for three times for the formation of the pattern of each color. The shadow mask, though easily deformable, is required to be of high precision. Therefore, such repeated mounting and dismounting is not desirable both quality-wise and process-wise. As a countermeasure to solve such a problem, automatic mount and dismount of the shadow mask may be availed, which is satisfactory to guarantee quality of the fluorescent screen and has many difficulties with reliability and economy of the automated system itself.

SUMMARY OF THE INVENTION

An object of this invention is to provide an improved method of forming a fluorescent screen for a color picture tube which can remove drawbacks of the prior art by reducing the frequency of mounting or dismounting of the shadow mask.

According to this invention, the above object can be accomplished by a method of forming a fluorescent screen for a color picture tube having triads of phosphor materials of three primary colors arranged a predetermined pattern on the inner surface of a panel comprising the steps of:

forming on the inner surface of the panel a photosensitive film which exhibits stickiness when exposed to a threshold amount of light;

exposing to light from a light source locations of the photosensitive film where a first color phosphor material of the primary three colors should occupy through a shadow mask mounted to the panel;

exposing to the light locations of the photosensitive film where a second color phosphor material should occupy through the shadow mask with the amount of light which is below the threshold;

exposing to the light locations of the photosensitive film where third color phosphor material should occupy through the shadow mask with the amount of light which is below the threshold;

dismounting the shadow mask and depositing the first color phosphor material onto the photosensitive film;

subjecting the panel to a first back exposure;

depositing the second color phosphor material onto the photosensitive film;

subjecting the panel to a second back exposure; and depositing the third color phosphor material onto the photosensitive film.

DESCRIPTION OF THE PREFERRED EMBODIMENTS

The inventors of this application noticed the fact that the photosensitive film which becomes sticky by light exposure must have exposure above a predetermined amount in order to exhibit the required stickiness.

The invention will now be described in more detail. In a method according to the invention, a solution of a substance which exhibits stickiness by light exposure is coated on the inner surface of a panel of a color picture tube to form a film. Among substances of this group, aqueous solution of dimethyl amino benzenediazonium chloride zinc chloride and water-soluble polymer has been known. After drying the film, a shadow mask is mounted on the panel. The panel mounted with the shadow mask is placed on an exposure table for photo-exposure. In the light-exposure step, locations of the photosensitive film to be occupied by a phosphor material of a first color are first exposed to light through the shadow mask by using a suitable light source. Thereafter, the locations for the second and/or the third colors are exposed to light without removing the shadow mask. The light quantity required for the exposure for the second and the third colors should be less than that for the first color. More particularly, even if the light quantity for the first color is sufficient to cause the photosensitive film to exhibit the stickiness, the light quantity for the second color and after should be less than the amount as to produce the stickiness. Alternatively, the amount of light for the exposure for the first color may be less than the amount to produce stickiness because the light quantity needed for the production of the stickiness can be supplemented by back exposure, i.e. the photo-exposure from the front of the panel. If the structure has a black matrix film (hereinafter referred to as BM film), the third color exposure can be conducted without the shadow mask as will be described later.

Figure 1:
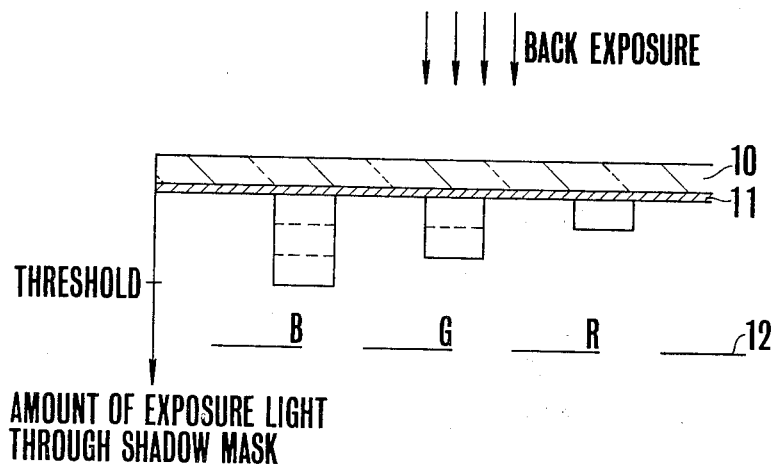
FIG. 1 is a diagrammatic representation useful to explain a method of the present invention.

FIG. 1 shows the manner of light-exposure suitable for mass-production of a non-black matrix type fluorescent screen. In the figure, reference numeral 10 denotes a panel and 11 a photosensitive film formed on the inner surface of the panel. As shown, the exposure for the first color, for example, blue (B) is conducted through a shadow mask 12 with the amount of light necessary for producing required stickiness, that is, at a threshold value or above. Relative position between the light source and the panel is displaced by shifting the former, for example. Then, the exposure for the second color, green (G), is conducted through the shadow mask with the amount of light which is $\frac{2}{3}$ of the threshold and for the third color, red (R), the exposure is conducted through the shadow mask with the amount of light which is $\frac{1}{3}$ of the threshold. After the light-exposures for the three primary colors have been completed, the shadow mask 12 is dismounted from the panel and a blue phosphor material is sprayed onto the photosensitive film and adhered only to the sticky locations thereof for blue color. Subsequent to this development of blue color phosphor material, the exposure for the second color is supplemented by back-exposure to provide the rest of the required amount, one/third, so as to produce stickiness for development of a green phosphor material. Further back-exposure is then carried out to produce stickiness for development of a red phosphor material.

It is not always necessary that the amount of light for the exposure for the first color is the threshold or above. If below the threshold, an additional back-exposure follows the exposure for the third color to thereby produce stickiness necessary for development of blue phosphor material.

Figure 2:
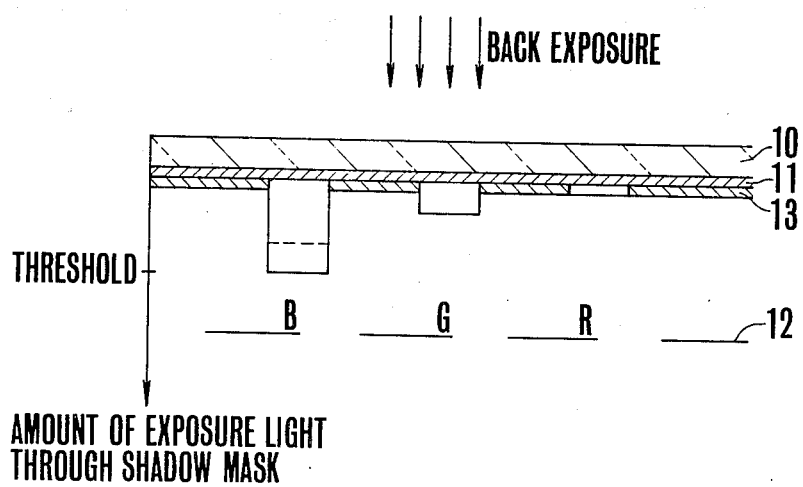
FIG. 2 is a diagrammatic representation useful to explain a method of the present invention as applied to a black matrix type fluorescent screen.

The process can be still more simplified for a fluorescent screen having a BM film, as shown in FIG. 2. In the figure, reference numeral 13 represents a BM film which is formed on a photosensitive film 11 in a well known manner in the art. In this case, the first exposure for blue (B) is conducted through the shadow mask with the amount of light which is the threshold or above. Subsequently the second exposure for green (G) is also conducted through the shadow mask with the amount of light which is below the threshold. The third exposure through the shadow mask, however, is not necessary because locations for red color are automatically determined after development of blue and green phosphor materials. The location for red can be made sticky only by back exposure alone. Obviously, if the first exposure is with the amount of light which is below the threshold, an additional back exposure is carried out for blue color before development of blue phosphor material.

In this manner, according to this invention, a fluorescent pattern for three colors can be formed with a shadow mask which has to be mounted and dismounted only once. If the shadow mask can be mounted and dismounted twice, still many combinations become possible. For example, during the first mount of the shadow mask, the first exposure is conducted with the amount of light which is the threshold. Thereafter, the shadow mask is dismounted and blue phosphor material is developed. The shadow mask is again mounted and the second and third exposures are carried out through the shadow mask with amounts of light which are the threshold and $\frac{1}{3}$ of the threshold, respectively. Green phosphor material is then developed. Finally, back exposure is carried out to produce stickiness for development of red phosphor material. This example can advantageously prevent cross-contamination because the development of blue phosphor material can be carried out while locations for green and red phosphor materials are not completely sticky.

To coat the phosphor material for development thereof, a dusting method may be employed wherein after admitting fluorescent powder into the panel inner face and spreading the same all over the face, excessive fluorescent powder is removed by air-spray. After forming such a phosphor film pattern of the three primary colors, with or without fixing, such a known method as filming, metal-backing, baking or the like is applied to complete a fluorescent screen.

The invention will now be explained with reference to a specific example.

Example

A photosensitive solution with the following composition is coated on the panel inner face having a BM film by a known rotary coating process.

| | |
|---|---|
| dimethylaminobenzenediazonium chloride zinc chloride | 3 wt % |
| alginic acid propylene glycol ester | 0.6 wt % |
| ethylene glycol | 0.2 wt % |
| surfactant | 0.003 wt % |
| water | remainder |

The temperature of the panel after coating is raised to about 50° C. to dry the film before the shadow mask is mounted on the inner face of the panel. The mask is placed upon the exposure table to expose the location where the blue phosphor material should be deposited to an extra-high voltage mercury lamp at a luminance of about 5 K lux on the panel face for about 3 minutes to produce stickiness. The location where the second color, green phosphor material in this case, should be deposited is exposed to light next at the same luminance as before and for about 1.5 minutes. This makes the light exposure for the second color about one half the amount of light which is the threshold. Under this condition, the shadow mask is removed from the panel, the blue phosphor powder is admitted into the inner face of the panel, the panel is rotated about 5 to 6 times in order to spread the powder sufficiently and the blue color phosphor material is deposited on the predetermined location by the air-spray development. Then, the location for the second color is exposed to light by back exposure at a luminance of about 6 K lux for about 1.5 minutes to produce stickiness so as to fix the green phosphor material on the predetermined location in a manner similar to the above-described blue color. Lastly, back exposure at a luminance of about 6 K lux is carried out for about 3 minutes to produce stickiness for the location where the third color, red color in this case, and the red phosphor material is then deposited. Thereafter, ammonium gas fixing process, filming, metal backing and baking are applied to complete a fluorescent screen.

The example described above has shown only one example of the photosensitive solution and the composition thereof. It can be naturally modified in the exposing method or in the composition of the photosensitive solution.

Accordingly, the present invention can reduce the time for mounting and dismounting a shadow mask remarkably as compared with the conventional methods, solve various problems encountered in such mounting and dismounting operations, and improve mass-production process.

What is claimed is:

1. A method of forming a fluorescent screen for a color picture tube having triads of phosphor materials of three primary colors arranged in a predetermined pattern on the inner surface of a panel comprising the steps of:
    forming on the inner surface of the panel a photosensitive film which exhibits stickiness when exposed to a threshold amount of light;
    exposing to light at threshold from a light source first locations of the photosensitive film where a first color phosphor material of the primary three colors should occupy through a shadow mask mounted to the panel;
    exposing to the light second locations of the photosensitive film where a second color phosphor material should occupy through the shadow mask with the amount of light which is below the threshold;
    exposing to the light third locations of the photosensitive film where third color phosphor material should occupy through the shadow mask with the amount of light which is below the said threshold and below the amount of light exposed on the said second locations;
    dismounting the shadow mask and depositing the first color phosphor material onto the photosensitive film;
    subjecting the panel to a first back exposure which brings only the second locations of the photosensitive material to stickiness;
    depositing the second color phosphor material onto the photosensitive film;
    subjecting the panel to a second back exposure which brings the third locations of the photosensitive material to stickiness; and
    depositing the third color phosphor material onto the photosensitive film.

2. A method of forming a fluorescent screen according to claim 1 wherein the exposure for the first color phosphor material is conducted with the amount of light which is at least the threshold.

3. A method of forming a fluorescent screen according to claim 1 wherein the exposure for the first color phosphor material is conducted with the amount of light which is below the threshold and an additional back exposure is conducted following the exposure for the third color phosphor material which brings the third locations of the photosensitive material to stickiness.

4. A method of forming a black matrix type fluorescent screen for a color picture tube having triads of phosphor materials of three primary colors arranged in a predetermined pattern on the inner surface of a panel comprising the steps of:
    forming on the inner surface of the panel a photosensitive film which exhibits stickiness when exposed to a threshold amount of light;
    forming on the photosensitive film a black matrix pattern film;
    exposing to light at threshold from a light source first locations of the photosensitive film where a first color phosphor material of the primary three colors should occupy through a shadow mask mounted to the panel;
    exposing to the light second locations of the photosensitive film where a second color phosphor material should occupy through the shadow mask with the amount of light which is below the threshold;
    dismounting the shadow mask and depositing the first color phosphor material onto the photosensitive film;
    subjecting the panel to a first back exposure which brings only the second locations to stickiness;
    depositing the second color phosphor material onto the photosensitive film;
    subjecting the panel to a second back exposure which brings a third location of the photosensitive film to a stickiness; and
    depositing the third color phosphor material on the third locations of the photosensitive film.

5. A method of forming a fluorescent screen according to claim 4 wherein the exposure for the first color phosphor material is conducted with the amount of light which is at least the threshold.

6. A method of forming a fluorescent screen according to claim 4 or 5 wherein the amount of exposure light for the second color phosphor material is larger than that for the third color phosphor material.

7. A method of forming a fluorescent screen according to claim 4 wherein the exposure for the first color phosphor material is conducted with the amount of light which is below the threshold and an additional back exposure is conducted following the exposure for the second color phosphor material.

8. A method of forming a black matrix type fluorescent screen for a color picture tube having triads of phosphor materials of three primary colors arranged in a predetermined pattern on the inner surface of a panel comprising the steps of:
    forming on the inner surface of the panel a black matrix pattern film;
    forming on the black matrix pattern film a photosensitive film which exhibits stickiness when exposed to a threshold amount of light;
    exposing to light at threshold from a light source first locations of the photosensitive film where a first color phosphor material of the primary three colors should occupy through a shadow mask mounted to the panel;
    exposing to the light second locations of the photosensitive film where a second color phosphor material should occupy through the shadow mask with the amount of light which is below the threshold;

dismounting the shadow mask and depositing the first color phosphor material onto the photosensitive film;
subjecting the panel to a first back exposure which brings only the second locations to stickiness;
depositing the second color phosphor material onto the photosensitive film;
subjecting the panel to a second back exposure which brings a third location of the photosensitive film to stickiness; and
depositing the third color phosphor material onto the third photosensitive film.

* * * * *

UNITED STATES PATENT AND TRADEMARK OFFICE
CERTIFICATE OF CORRECTION

PATENT NO. : 4,324,850
DATED : April 13, 1982
INVENTOR(S) : Yoshifumi Tomita; Masahiro Nishizawa, et al It is certified that error appears in the above—identified patent and that said Letters Patent is hereby corrected as shown below:

In the Legend:

[73] Assignee: "Hitaci, Ltd.," should be -- Hitachi, Ltd. --.

Column 4, line 49, "50°C." should be -- 50°C --.

Signed and Sealed this

Tenth Day of August 1982

[SEAL]

Attest:

GERALD J. MOSSINGHOFF

Attesting Officer

Commissioner of Patents and Trademarks